United States Patent [19]

Bass et al.

[11] Patent Number: 4,593,205
[45] Date of Patent: Jun. 3, 1986

[54] MACROCELL ARRAY HAVING AN ON-CHIP CLOCK GENERATOR

[75] Inventors: Alan S. Bass; Shi-Chuan Lee, both of Mesa, Ariz.

[73] Assignee: Motorola, Inc., Schaumburg, Ill.

[21] Appl. No.: 510,042

[22] Filed: Jul. 1, 1983

[51] Int. Cl.[4] .................. H03K 5/135; H03K 5/14; H03K 19/086; H01L 27/10

[52] U.S. Cl. .................. 307/269; 307/467; 307/601; 307/602; 307/608; 307/303; 307/455; 357/45; 357/68

[58] Field of Search .............. 307/262, 269, 265, 465, 307/466, 467, 595, 597, 601–603, 608, 303; 357/45, 68; 364/489–491

[56] References Cited

U.S. PATENT DOCUMENTS

| | | | |
|---|---|---|---|
| 3,522,446 | 8/1970 | Kodama | 307/455 |
| 3,686,512 | 8/1972 | Kroos | 307/455 |
| 3,808,475 | 4/1974 | Beulow et al. | 357/45 X |
| 3,906,212 | 9/1975 | Poguntke | 307/455 X |
| 4,069,429 | 1/1978 | White et al. | 307/265 |
| 4,140,927 | 2/1979 | Feucht | 307/602 |
| 4,233,525 | 11/1980 | Takahashi | 307/455 X |
| 4,278,897 | 7/1981 | Ohno et al. | 307/455 |
| 4,517,476 | 5/1985 | Barre | 307/455 |

FOREIGN PATENT DOCUMENTS

| | | | |
|---|---|---|---|
| 0073641 | 3/1983 | European Pat. Off. | 357/45 |
| 0020448 | 2/1982 | Japan | 357/45 |
| 0133662 | 8/1982 | Japan | 357/45 |

OTHER PUBLICATIONS

Mukai et al., "Master Slice ECL LSI"; *Review of the Electrical Communication Laboratories*; vol. 26, Nos. 9-10/Sep.-Oct. 1978; pp. 1325-1338.

Lee et al., "A 2500-Gate Bipolar Macro Cell Array With 250 ps Gate Delay"; IEEE-ISSCC 82; 2/11/1982; Digest of Technical Papers, pp. 178-179.

*Primary Examiner*—Larry N. Anagnos
*Attorney, Agent, or Firm*—William E. Koch

[57] ABSTRACT

A macrocell array is provided wherein a plurality of cells, each having a plurality of semiconductor devices interconnected for providing logic functions, are selectively interconnected to one another and to input/output pads by a plurality of horizontal and vertical routing channels in one or more metallization layers. An on-chip clock generator is provided within one of the cells and comprises a gate means responsive to an input signal and providing a delayed signal. An output means is coupled to the gate means and is responsive to the input signal and the delayed signal for generating a clock pulse. The gate means includes two or more serially connected sets of differentially connected transistors wherein the time between the input signal and the delayed signal is the summation of the propagation delays of the two or more serially connected sets of differentially connected transistors. External override signals allow for control of the clock pulse regardless of the state of the input signal.

2 Claims, 5 Drawing Figures

MACROCELL ARRAY HAVING AN ON-CHIP CLOCK GENERATOR

BACKGROUND OF THE INVENTION

1. Field of the Invention

This invention relates in general to macrocell arrays and, more particularly, to a multi-gate bipolar macrocell array having an on-chip clock generator.

2. Background Art

To satisfy the demand for large scale digital integrated circuits, the semiconductor industry has developed three basic approaches. These include standard, off the shelf circuits; custom circuits; and gate arrays. The standard, off the shelf circuit provides the lowest cost option due to the quantities manufactured, but are limited in providing the flexibility for the circuit desired. The custom circuit is cost limiting unless the number of circuits desired is large. The gate array involves a standard array of a large number of gate circuits diffused into a chip. The metallization pattern converting these gate circuits into functional custom circuits is processed according to the customer's requirement.

A macrocell array is an extension of the gate array concept. A macrocell is an array subsection performing a higher level logic function than a basic gate. A macrocell array is an array circuit in which macro functions used to define logic simulations are directly implemented within the basic cell structure rather than formed by interconnecting logic gates. Each cell in a macrocell array contains a number of unconnected transistors and resistors. A metallization interconnecting pattern transforms the interconnected transistors and resistors within each cell into Small Scale Integrated (SSI) logic functions, called macros. The macros take the form of standard logic elements such as dual type "D" flip-flops, dual full adders, quad latches, and many other predefined functions. The macros are also interconnected by the metallization to form the desired Large Scale Integrated (LSI) design. The high density packing of a macrocell array chip offers up to a fifty to one reduction in system component count, with a power dissipation improvement of as much as five to one.

A typical macrocell array has input cells for receiving an input and for logic functions, output cells for providing an output and for logic functions, major cells for receiving an input and for logic functions, bias generator cells providing bias voltages, and clock generator cells for providing clock pulses. Only the bias generator cells would not be connected to an input/output pad.

However, the previously known macrocell arrays have drawbacks that have presented problems for both the designer and the end user. Clock generators used to clock the gates of a macrocell array typically have a narrow pulse. A clock pulse typically has a large fan-out; that is, it must drive a large number of gates. This large fan-out causes the narrow pulse to shrink. If the magnitude of the pulse shrinkage is too great, the pulse will become so narrow as to cause improper circuit operation. Additional pulse width problems arise because some chips are slower than others, and the slower chips require a wider pulse.

Thus, what is needed is a macrocell array having an on-chip clock generator having a narrow pulse with reduced sensitivity to large fan-out.

SUMMARY OF THE INVENTION

Accordingly, it is an object of the present invention to provide an improved macrocell array.

A still further object of the present invention is to provide a macrocell array having an on-chip clock generator.

Yet another object of the present invention is to provide a macrocell array including an on-chip clock generator having a narrow pulse In carrying out the above and other objects of the invention in one form, there is provided a macrocell array having a plurality of cells, each of said cells having a plurality of semiconductor devices. The semiconductor devices are interconnected within each cell to provide logic functions. A plurality of horizontal routing channels within one or more metallization layers are connected to input/output points of the logic functions within and between each cell. A plurality of vertical routing channels within the metallization layers are coupled between the horizontal routing channels and input/output pads.

An on-chip clock generator is provided within one of said plurality of cells. The clock generator includes a gate means coupled to one of said plurality of input/output pads and is responsive to an input signal and provides a delayed signal as an output. An output means is coupled to said gate means and is responsive to the input signal and the delayed signal for generating a clock pulse. External override signals allow for the control of the clock pulse regardless of the input signal.

The above and other objects, features, and advantages of the present invention will be better understood from the following detailed description taken in conjunction with the accompanying drawings.

DETAILED DESCRIPTION OF THE INVENTION

Figure 1:
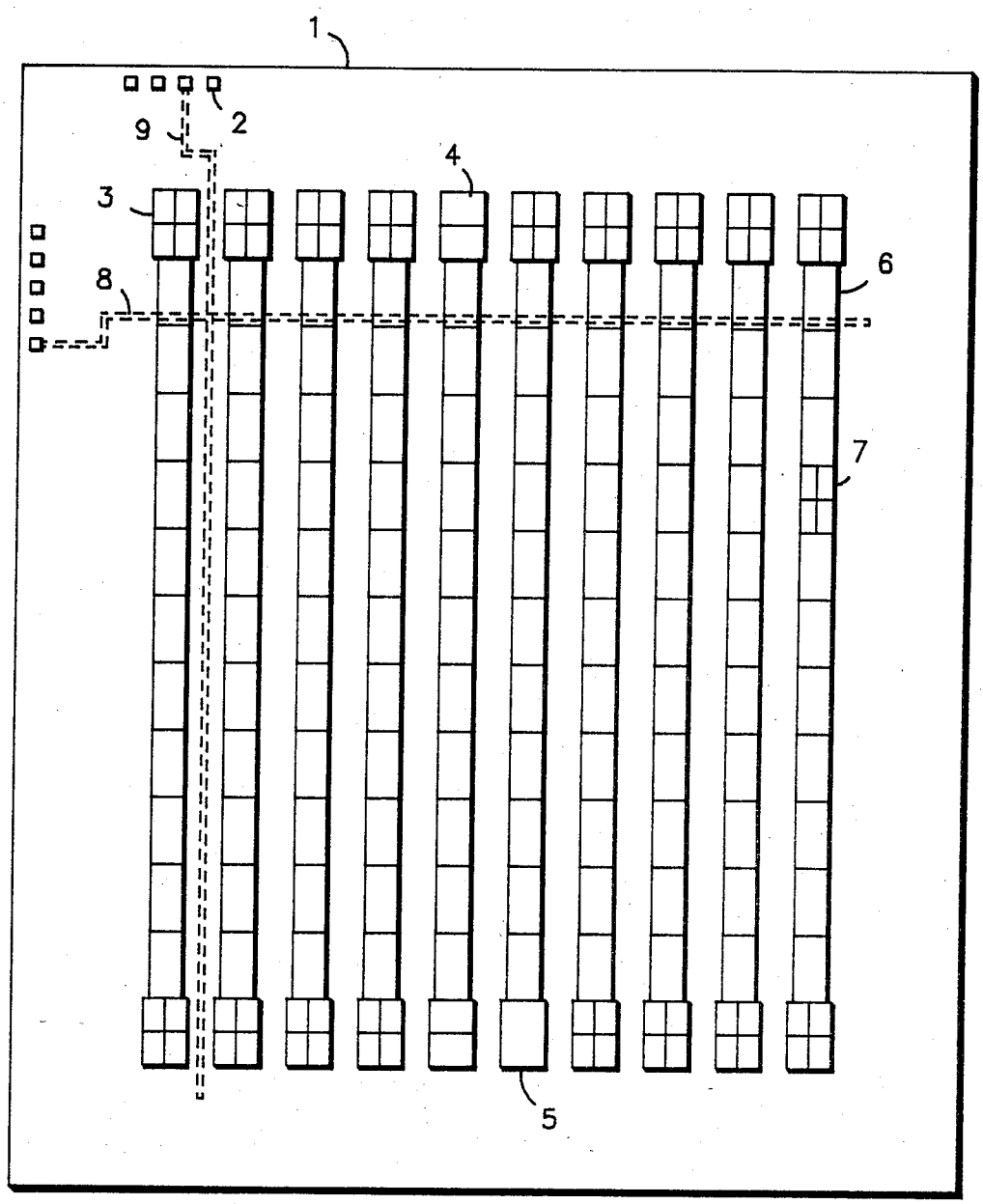
FIG. 1 is a diagram of the layout of a macrocell array.

FIG. 1 shows a macrocell array comprising a silicon semiconductor substrate 1 having input/output pads 2, output cells 3, bias generator cells 4, clock generator cell 5, and major cells 6. Routing channels within metallization layers (not shown) interconnect any of the cells to one another and to input/output pads 2 in a manner determined by the logic desired. Cells 3, 4, 5, 6 are in horizontal proximity; however, no actual electrical contact is established between cells until metallization. Each cell contains a plurality of semiconductor devices which may be connected by the metallization layer in a way to provide certain functions. Each cell may be further divided into two or more logic units 7.

Three metallization layers (not shown) are utilized wherein the first two layers interconnect macros and the third layer interconnects power bussing in a manner known to those skilled in the art. Horizontal routing channels 8 within the metallization layers connect any of the cells to one another and to input/output pads 2, if required, in a manner determined by the logic desired. Although only one horizontal routing channel 8 is shown, as many as thirty may cross each horizontal row of cells.

Vertical routing channels 9 within the metallization layers weave between and across horizontal routing channels 8 connecting therewith for providing a desired logic. Vertical routing channels 9 do not pass over the cells but are located between each vertical column of cells. Although only one vertical routing channel 9 is shown, the actual number will be larger and will vary depending on each chip's requirements.

Figures 2, 3:
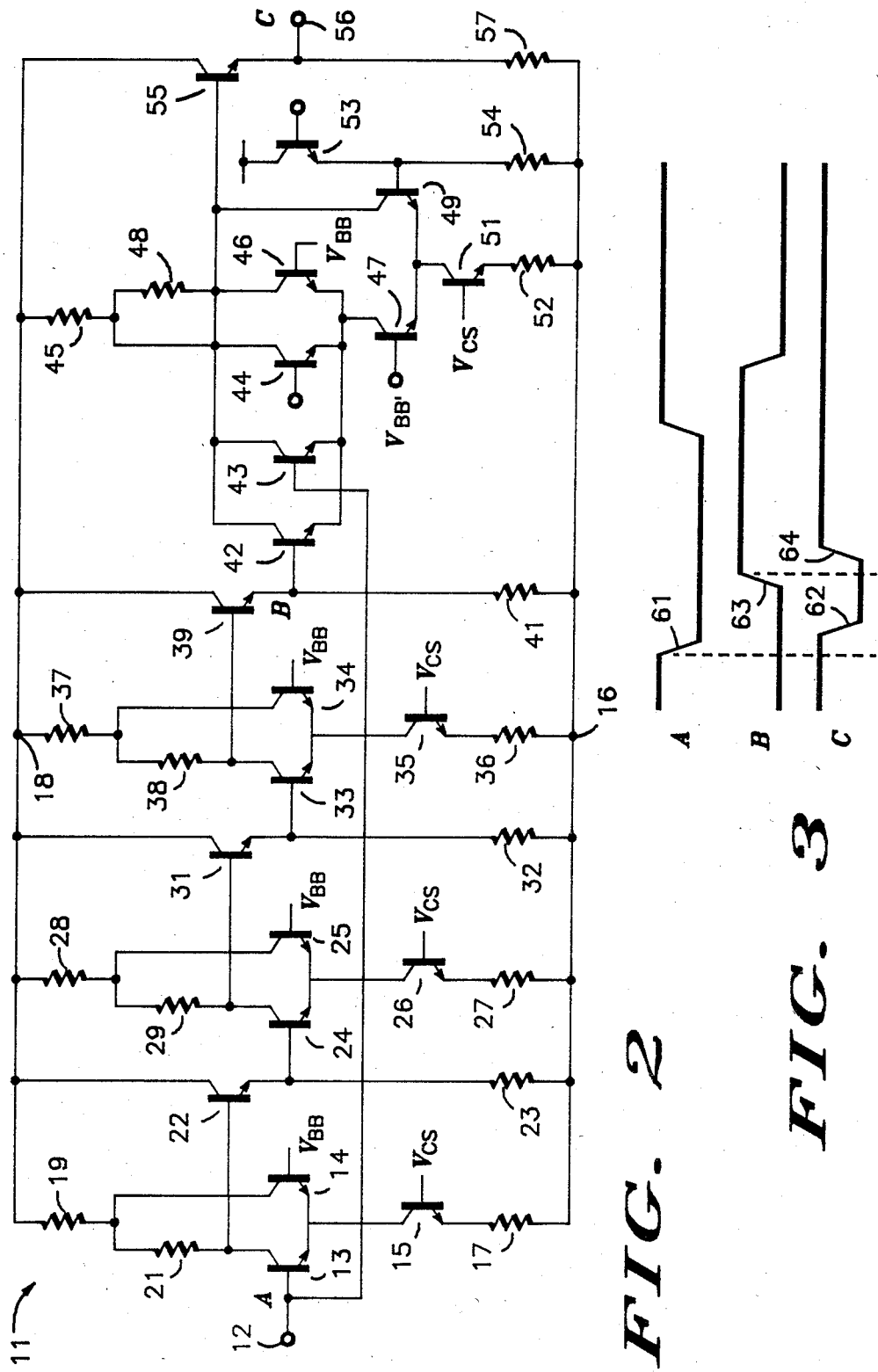
FIG. 2 illustrates the preferred embodiment of the present invention.
FIG. 3(A-C) illustrates waveforms at selected points in the preferred embodiment of the present invention.

Referring to FIG. 2, a clock generator 5 (FIG. 1) includes gate circuit 11 responsive to an input signal at terminal 12. Terminal 12 may be one of any of input/output pads 2. By having the clock generator 5 on-chip, the relative slowness of one chip respective to another chip is compensated for; that is, the pulse produced by a slow chip will be wider than the pulse produced by a fast chip, thereby satisfying the pulse width requirement. Transistor 13 has a base connected to terminal 12 and an emitter connected to the emitter of differentially connected transistor 14 and to the collector of current source transistor 15. Transistor 15 has a base adapted to receive a bias voltage $V_{CS}$ and an emitter coupled to voltage supply line 16 by resistor 17. Transistor 14 has a base adapted to receive a bias voltage $V_{BB}$, and a collector coupled to voltage supply line 18 by resistor 19 and coupled to the collector of transistor 13 by resistor 21. The collector of transistor 13 is further connected to the base of emitter follower transistor 22. Transistor 22 has a collector coupled to voltage supply line 18 and an emitter coupled to supply voltage line 16 by resistor 23 and connected to the base of transistor 24. Transistor 24 has an emitter connected to the emitter of differentially connected transistor 25 and to the collector of current source transistor 26. Transistor 26 has a base adapted to receive bias voltage $V_{CS}$ and an emitter coupled to supply voltage line 16 by resistor 27. Transistor 25 has a base adapted to receive bias voltage $V_{BB}$ and a collector coupled to supply voltage line 18 by resistor 28 and coupled to the collector of transistor 24 by resistor 29. The collector of transistor 24 is further connected to the base of emitter follower transistor 31. Transistor 31 has a collector connected to supply voltage line 18 and an emitter coupled to supply voltage line 16 by resistor 32 and connected to the base of transistor 33. Transistor 33 has an emitter connected to the emitter of differentially connected transistor 34 and to the collector of current source transistor 35. Transistor 35 has a base adapted to receive bias voltage $V_{CS}$ and an emitter coupled to supply voltage line 16 by resistor 36. Transistor 34 has a base adapted to receive bias voltage $V_{BB}$, and a collector coupled to supply voltage line 18 by resistor 37 and coupled to the collector of transistor 33 by resistor 38. The collector of transistor 33 is further connected to the base of emitter follower transistor 39. Transistor 39 has a collector connected to supply voltage line 18 and an emitter coupled to supply voltage terminal 16 by resistor 41 and connected to the base of transistor 42. The base of transistor 43 is connected to input terminal 12 and the base of transistor 44 is adapted to receive an external override high signal. The collectors of transistors 42, 43, 44 are coupled to supply voltage terminal 18 by resistor 45. The emitters of transistors 42, 43, 44 are connected to the emitter of differentially connected transistor 46 and to the collector of transistor 47. Transistor 46 has a base adapted to receive bias voltage $V_{BB}$ and a collector coupled to the collector of transistors 42, 43, 44 by resistor 48. Transistor 47 has a base adapted to receive bias voltage $V_{BB}'$ and an emitter connected to the emitter of differentially connected transistor 49 and to the collector of current source transistor 51. The base of transistor 51 is adapted to receive bias voltage $V_{CS}$ and has an emitter coupled to voltage supply line 16 by resistor 52. The base of transistor 49 is connected to the emitter of transistor 53 and coupled to voltage supply line 16 by resistor 54. The base of transistor 53 is adapted to receive an external override low signal and has a collector connected to supply voltage line 18. The collector of transistor 49 is connected to the collector of transistor 46 and to the base of transistor 55. Transistor 55 has a collector connected to supply voltage line 18 and an emitter connected to output terminal 56 and coupled to supply voltage line 16 by resistor 57.

Initially, assume that the bases of transistors 42, 44, 53 are all low, and terminal 12 is high. Then the output at terminal 56 will be high. A negative going transition applied to input terminal 12 will turn off transistor 13 causing the base of transistor 22 to go high. With transistor 22 conducting, the base of transistor 24 will be high, thus turning on transistor 24 and causing its collector to go low. As the base of transistor 31 goes low, the base of transistor 33 goes low. With transistor 33 turned off, the base of transistor 39 is high and the base of transistor 42 will be high.

However, the base of transistor 42 will not become high until three gate delays after the base of transistor 43 becomes low. The number of gate delays may be increased or decreased to change the pulse width. The invention is not meant to be limited to the three gate delays as shown. During this three gate delay interval, the bases of transistors 42, 43, 44 and 55 are all low, and therefore the output at terminal 56 will also be low. This will be better understood by referring to the waveforms of FIG. 3. Waveform A represents the input signal at terminal 12 as applied to the bases of transistors 13, 43. Waveform B represents the signal applied to the base of transistor 42. Waveform C represents the output signal at terminal 56. When waveform A transitions downward at 61, waveform C will transition downward at 62 after a small delay due to the propagation delay inherent in transistors 43, 46, 55. After a three gate delay, waveform B will transition upward at 63. Waveform C will then transition upward at 64 after a small delay associated with transistors 43, 46, 45.

As soon as transistor 42 turns on, current is diverted away from transistor 46 and the collector of transistor 46 will go high, pulling up transistor 55 and causing output terminal 56 to go high. Transistor 55 is a large transistor, and resistor 57 is designed so as to draw a large current, thereby enabling the clock pulse to have reduced sensitivity to large fan-out.

An external override high signal applied to the base of transistor 44 will divert current away from transistor 46 causing output terminal 56 to go high regardless of the input signal at terminal 12. And an external override low signal applied to the base of transistor 53 will cause the base of transistor 49 to go high, thus sinking current from the base of transistor 55 and causing output terminal 56 to go low, regardless of the input signal at terminal 12 and the state of the external override high signal. This arrangement allows for manual control of the clock pulse.

By now it should be appreciated that there has been provided a macrocell array including an on-chip clock generator having a narrow pulse with reduced sensitivity to large fan-out.

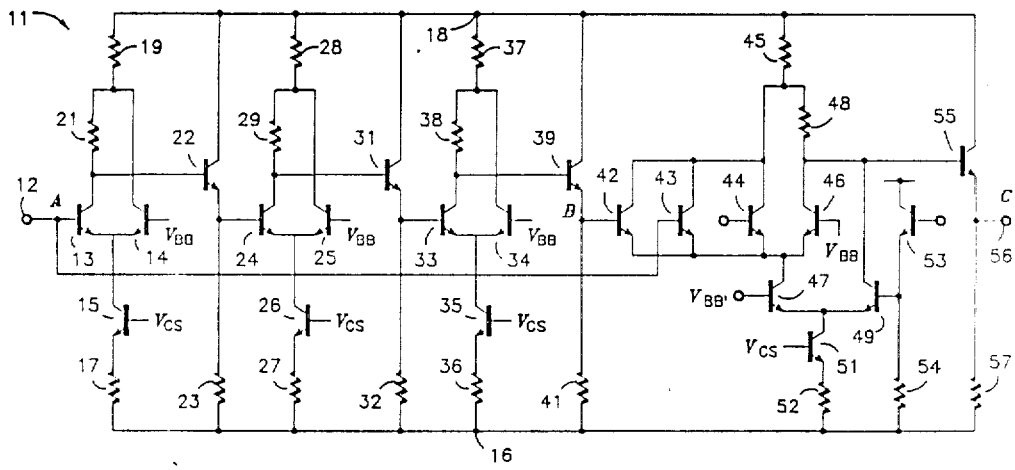

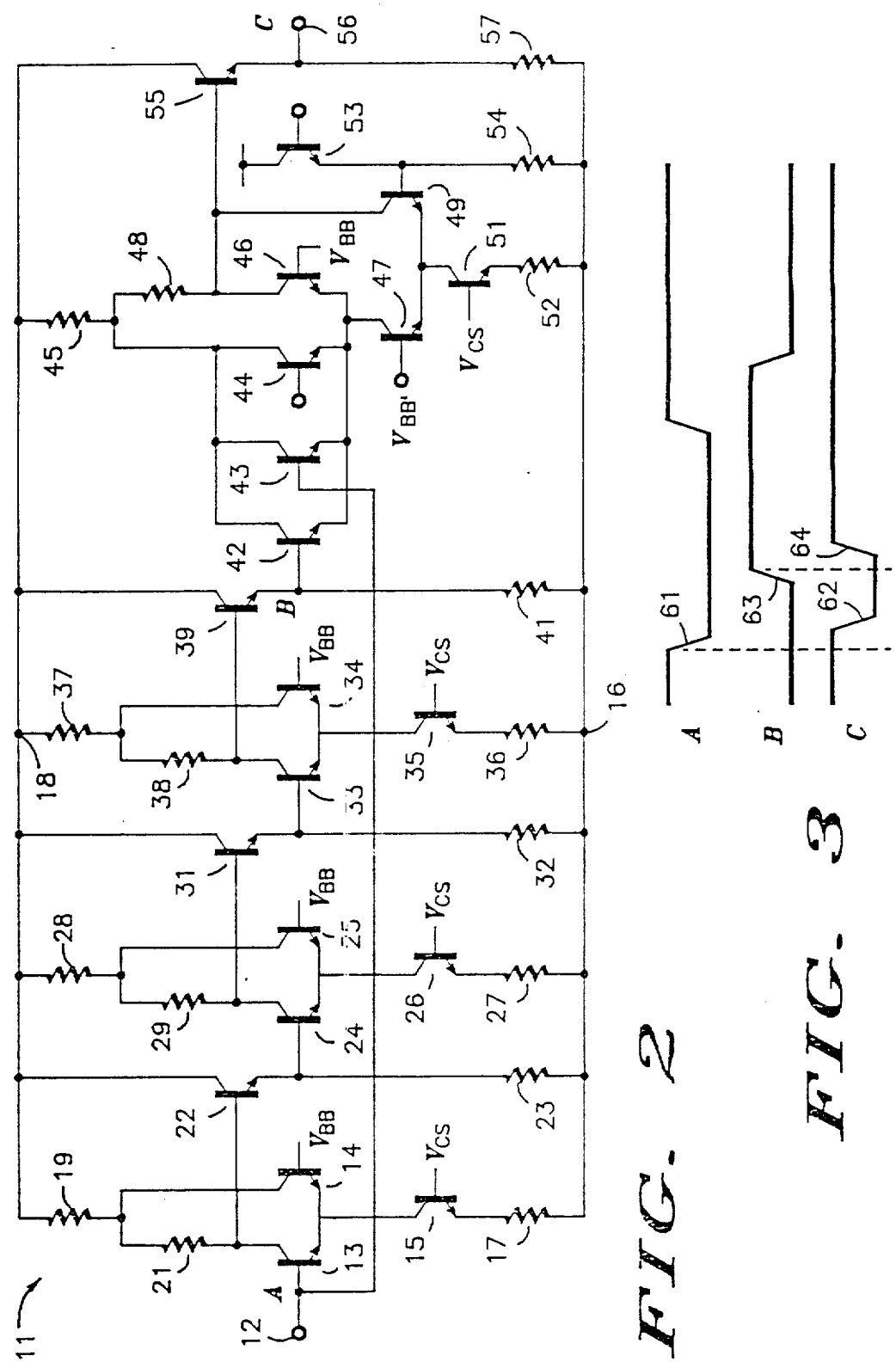

We claim:

1. A macrocell array comprising:
   a plurality of cells, each of said cells having a plurality of semiconductor devices, said semiconductor devices being interconnected within each cell to provide logic functions;
   a plurality of input/output pads, each adapted to receive an input signal;
   a plurality of horizontal routing channels within one or more metallization layers overlying said cells, said horizontal routing chennels being coupled to said plurality of semiconductor devices at selected input/output points of said logic functions;
   a plurality of vertical routing channels within said one or more metallization layers overlying said cells, said vertical routing channels coupled to said horizontal routing channels and said input/output pads;
   a clock generator included within one of said plurality of cells, comprising:
      gate means coupled to one of said plurality of input/output pads and responsive to an input signal, and having a delayed signal as an output;
      a first transistor having a base coupled to a first reference voltage;
      a second transistor having a base coupled to said one of said plurality of input/output pads and differentially connected to said first transistor;
      a third transistor having a base coupled to said gate means and responsive to said delayed signal, and differentially connected to said first transistor;
      a fourth transistor having a base coupled to a collector of said first transistor and an emitter coupled to an output terminal for providing an output signal; and
      a fifth transistor having a base adapted to receive an external override high signal and differentially connected to said first transistor for controlling said output signal regardless of said input signal; and
   means coupled to said base of said fourth transistor and adapted to receive an external override low signal for controlling said output signal regardless of said input signal and said external override high signal.

2. The macrocell array according to claim 1 further comprising:
   a sixth transistor having a base for coupling to a second reference voltage and a collector coupled to the emitters of said first, second, third and fifth transistors;
   a seventh transistor having a collector coupled to said base of said fourth transistor, and differentially connected to said sixth transistor; and
   an eighth transistor having a base for coupling to said external override low signal, and an emitter coupled to a base of said seventh transistor.

* * * * *

UNITED STATES PATENT AND TRADEMARK OFFICE
CERTIFICATE OF CORRECTION

PATENT NO. : 4,593,205

DATED : June 3, 1986

INVENTOR(S) : Alan S. Bass et al

It is certified that error appears in the above-identified patent and that said Letters Patent is hereby corrected as shown below:

The title page showing the illustrative figure should be deleted to be replaced with the attached title page.

Sheet 2 of the drawings, consisting of Figs. 1 and 2, should be deleted to be replaced with the sheet of drawings, consisting of Figs. 1 and 2, as shown on the attached page.

Signed and Sealed this

Fourteenth Day of July, 1992

Attest:

DOUGLAS B. COMER

*Attesting Officer*    Acting Commissioner of Patents and Trademarks

United States Patent [19]
Bass et al.

[11] Patent Number: 4,593,205
[45] Date of Patent: Jun. 3, 1986

[54] MACROCELL ARRAY HAVING AN ON-CHIP CLOCK GENERATOR

[75] Inventors: Alan S. Bass; Shi-Chuan Lee, both of Mesa, Ariz.

[73] Assignee: Motorola, Inc., Schaumburg, Ill.

[21] Appl. No.: 510,042

[22] Filed: Jul. 1, 1983

[51] Int. Cl.[4] .................. H03K 5/135; H03K 5/14; H03K 19/086; H01L 27/10

[52] U.S. Cl. ........................... 307/269; 307/467; 307/601; 307/602; 307/608; 307/303; 307/455; 357/45; 357/68

[58] Field of Search .............. 307/262, 269, 265, 465, 307/466, 467, 595, 597, 601–603, 608, 303; 357/45, 68; 364/489–491

[56] References Cited

U.S. PATENT DOCUMENTS

| | | | |
|---|---|---|---|
| 3,522,446 | 8/1970 | Kodama | 307/455 |
| 3,686,512 | 8/1972 | Kroos | 307/455 |
| 3,808,475 | 4/1974 | Beulow et al. | 357/45 X |
| 3,906,212 | 9/1975 | Poguntke | 307/455 X |
| 4,069,429 | 1/1978 | White et al. | 307/265 |
| 4,140,927 | 2/1979 | Feucht | 307/602 |
| 4,233,525 | 11/1980 | Takahashi | 307/455 X |
| 4,278,897 | 7/1981 | Ohno et al. | 307/455 |
| 4,517,476 | 5/1985 | Barre | 307/455 |

FOREIGN PATENT DOCUMENTS

| | | | |
|---|---|---|---|
| 0073641 | 3/1983 | European Pat. Off. | 357/45 |
| 0020448 | 2/1982 | Japan | 357/45 |
| 0133662 | 8/1982 | Japan | 357/45 |

OTHER PUBLICATIONS

Mukai et al., "Master Slice ECL LSI"; *Review of the Electrical Communication Laboratories;* vol. 26, Nos. 9-10/Sep.-Oct. 1978; pp. 1325–1338.

Lee et al., "A 2500-Gate Bipolar Macro Cell Array With 250 ps Gate Delay"; IEEE-ISSCC 82; 2/11/1982; Digest of Technical Papers, pp. 178-179.

*Primary Examiner*—Larry N. Anagnos
*Attorney, Agent, or Firm*—William E. Koch

[57] ABSTRACT

A macrocell array is provided wherein a plurality of cells, each having a plurality of semiconductor devices interconnected for providing logic functions, are selectively interconnected to one another and to input/output pads by a plurality of horizontal and vertical routing channels in one or more metallization layers. An on-chip clock generator is provided within one of the cells and comprises a gate means responsive to an input signal and providing a delayed signal. An output means is coupled to the gate means and is responsive to the input signal and the delayed signal for generating a clock pulse. The gate means includes two or more serially connected sets of differentially connected transistors wherein the time between the input signal and the delayed signal is the summation of the propagation delays of the two or more serially connected sets of differentially connected transistors. External override signals allow for control of the clock pulse regardless of the state of the input signal.

2 Claims, 5 Drawing Figures